US006532642B1

(12) United States Patent
Wingo

(10) Patent No.: US 6,532,642 B1
(45) Date of Patent: Mar. 18, 2003

(54) METHOD OF MAKING A SILICON CARBIDE RAIL FOR USE IN A SEMICONDUCTOR WAFER CARRIER

(75) Inventor: Larry S. Wingo, Rhome, TX (US)

(73) Assignee: Union Oil Company of California, Brea, CA (US)

( * ) Notice: Subject to any disclaimer, the term of this patent is extended or adjusted under 35 U.S.C. 154(b) by 163 days.

(21) Appl. No.: 09/677,055

(22) Filed: Sep. 29, 2000

Related U.S. Application Data

(62) Division of application No. 09/165,542, filed on Oct. 2, 1998, now Pat. No. 6,171,400.

(51) Int. Cl.[7] .................................................. B23P 13/04
(52) U.S. Cl. .......................... 29/558; 118/500; 118/728; 206/710; 206/711; 206/832; 211/41.18; 269/902; 269/904; 414/935; 414/941
(58) Field of Search ................................. 118/500, 724, 118/725, 728; 211/41.18; 206/454, 710, 711, 712, 832, 833; 414/935, 936, 937, 934, 939, 940, 941; 269/909, 902; 29/558, 557; 423/346

(56) References Cited

U.S. PATENT DOCUMENTS

| | | | | |
|---|---|---|---|---|
| 1,013,700 A | * | 1/1912 | Tone ........................... 423/346 |
| 3,634,116 A | * | 1/1972 | Woerner .................. 427/249.16 |
| 4,153,164 A | | 5/1979 | Hofmeister et al. ........... 211/41 |
| 4,407,654 A | | 10/1983 | Irwin ........................... 432/258 |
| 4,566,839 A | * | 1/1986 | Butler ......................... 414/404 |
| 4,653,636 A | * | 3/1987 | Armstrong .................. 206/711 |
| 4,966,549 A | * | 10/1990 | Ohdate ........................ 432/253 |
| 4,998,879 A | * | 3/1991 | Foster et al. ................. 432/253 |
| 5,020,476 A | * | 6/1991 | Bay et al. ..................... 118/728 |
| 5,169,684 A | * | 12/1992 | Takagi ...................... 427/248.1 |
| 5,219,079 A | | 6/1993 | Nakamura .................... 211/41 |
| 5,431,561 A | | 7/1995 | Yamada et al. .............. 432/253 |
| 5,468,297 A | * | 11/1995 | Letort .......................... 118/728 |
| 5,482,559 A | * | 1/1996 | Imai et al. .................... 118/728 |
| 5,492,229 A | | 2/1996 | Tanaka et al. .................. 211/41 |
| 5,494,524 A | | 2/1996 | Inaba et al. .................. 118/728 |
| 5,507,873 A | | 4/1996 | Ishizuka et al. ............. 118/728 |
| 5,534,074 A | | 7/1996 | Koons ......................... 118/728 |
| 5,586,880 A | | 12/1996 | Ohsawa ....................... 432/241 |
| 5,704,493 A | * | 1/1998 | Fujikawa et al. ......... 211/41.16 |
| 5,725,100 A | * | 3/1998 | Yamada ....................... 206/710 |

(List continued on next page.)

FOREIGN PATENT DOCUMENTS

| | | |
|---|---|---|
| EP | 0309272 | 3/1989 |
| EP | 0884769 | 12/1998 |
| JP | 6349758 | 12/1994 |
| JP | 10203584 | 8/1998 |
| WO | WO 92 06342 | 4/1992 |
| WO | WO 96 35228 | 11/1996 |
| WO | WO9732339 | 9/1997 |

OTHER PUBLICATIONS

Batch Or Single–Wafer Thermal Treatment For 300 MM Wafers, Japan Report, *Semiconductor International*, Jun. 1995, p. 58.

Primary Examiner—Gregory M. Vidovich
Assistant Examiner—Marc Jimenez
(74) Attorney, Agent, or Firm—Bracewell & Patterson, L.L.P.

(57) ABSTRACT

A silicon carbide rail for use as a support in an apparatus for holding semiconductor wafers is made by forming a first series of parallel slots or grooves into the front side of a graphite plate usually without piercing the back side of the plate, converting the slotted graphite plate into a slotted silicon carbide plate, and forming a second series of parallel slots into the back side of the slotted silicon carbide plate such that each slot on the back side connects with a corresponding slot on the front side. The width of each back side slot is less than that of the corresponding front side slot, thereby forming rail teeth having a ledge running along their to top surfaces.

8 Claims, 6 Drawing Sheets

U.S. PATENT DOCUMENTS

| | | | |
|---|---|---|---|
| 5,779,797 A | | 7/1998 | Kitano ........................ 118/500 |
| 5,782,361 A | * | 7/1998 | Kakizaki et al. ............. 206/711 |
| 5,782,362 A | * | 7/1998 | Ohori ......................... 206/711 |
| 5,788,082 A | * | 8/1998 | Nyseth ........................ 206/711 |
| 5,858,103 A | * | 1/1999 | Nakajima et al. ........... 118/728 |
| 5,865,320 A | | 2/1999 | Hamada ...................... 211/40 |
| 5,865,321 A | | 2/1999 | Tomanovich ................ 211/40 |
| 5,890,598 A | | 4/1999 | Hayashida et al. ......... 206/710 |
| 5,897,311 A | | 4/1999 | Nishi .......................... 432/239 |
| 5,931,666 A | | 8/1999 | Hengst ....................... 432/258 |
| 6,031,205 A | * | 2/2000 | Shimazu ..................... 219/390 |
| 6,056,123 A | | 5/2000 | Niemirowski et al. ...... 206/711 |
| 6,099,645 A | * | 8/2000 | Easley et al. ............... 118/500 |
| 6,221,478 B1 | * | 4/2001 | Kammeyer ............. 428/307.7 |

* cited by examiner

METHOD OF MAKING A SILICON CARBIDE RAIL FOR USE IN A SEMICONDUCTOR WAFER CARRIER

CROSS REFERENCES TO RELATED APPLICATIONS

This application is a division of U.S. patent application Ser. No. 09/165,542 filed in the United States Patent and Trademark Office on Oct. 2, 1998 now U.S. Pat. No. 6,171,400 issued Aug. 9, 2001.

BACKGROUND OF INVENTION

This invention relates generally to vertical carriers or boats for holding semiconductor wafers during heat processing and is particularly concerned with a vertical carrier designed to effectively support large semiconductor wafers having nominal diameters equal to or greater than about 200 millimeters, preferably wafers having nominal diameters of about 300 millimeters or greater.

Semiconductor wafers, especially those made of silicon, may be conventionally processed by placing them horizontally into a holding device or carrier at intervals in the vertical direction and exposing the wafer's surfaces to high temperature gases in a furnace, usually to form an oxide film on these surfaces or to deposit certain atoms therein. To maximize the amount of surface area exposed to the heat treatment, the wafers are usually held in "boats" or carriers typically comprised of parallel vertical supports or rails having relatively short slots evenly spaced along their length. The slots in one support are normally aligned with slots in the other support so a wafer can be jointly received by a corresponding slot in each support. By placing wafers in appropriate slots on the supports, the boat can carry a stack of wafers separated from each other so that both sides of the wafer are exposed to the heat treatment.

In the past, conventional vertical boats and carriers have been designed to support wafers having nominal diameters of 200 millimeters or less. These size wafers are typically supported by slots on the vertical rails that extend inward around the edge of the wafer only a very short distance, usually less than about 20 millimeters. Unfortunately, when such a design is utilized to support larger wafers, i.e., wafers having a nominal diameter greater than about 200 millimeters, the wafers are deflected by their own weight and tend to sag. As the temperature in the furnace rises, this sagging or deformation results in crystal dislocation or "slip" and other stresses on the wafer. Although "slip" typically begins to occur at about 1200° C. for wafers having nominal diameters of 200 millimeters, it probably occurs at a temperature of 1000° C. or less for wafers having diameters of 300 millimeters or larger. Crystal dislocations caused by stresses on the wafers result in a decrease in the number of chips that can be made on a wafer. This reduction in product yield increases with wafer size, and therefore the processing of larger wafers in conventional vertical boats has been generally avoided.

Various techniques have been suggested in an attempt to decrease the bending stress on wafers. One method suggested is to locate the rails or vertical supports of the boat or carrier more toward the front of the carrier where the wafers are loaded. This, however, is difficult because of the need for an unobstructed wafer loading path. Another technique for decreasing bending stress on large wafers is taught in U.S. Pat. No. 5,492,229, the disclosure of which patent is incorporated herein by reference in its entirety. This patent teaches the use of relatively long support teeth, i.e., the support arms formed by long slits or slots on the support rail, with small contact pads located at or near the end of the teeth for supporting the wafers toward their center and not at their edges. According to this patent, the contact pads or support projections are located such that the inner portion of each wafer is supported by the pad while the peripheral portion, i.e., the portion of the wafer which extends from the edge of the wafer inward a distance of up to 10% of the wafer's radius, does not contact the pads or arms. By supporting the wafers at their inner portion, this design not only reduces the stress on the wafer caused by its own weight but also decreases heat stress caused by direct heat transfer to the wafer from the slits in the vertical supports.

Although the above-discussed patent proposes the use of long support arms or teeth in order to decrease stress on the wafer, the wafer support is far from uniform as it relies on small contact pads located at or near the end of the support arms, which pads occupy only a small portion of the length of the support arm and contact only a small area of each wafer. Moreover, the design shown in the patent results in reduced tooth strength caused by the removal of material from the top of the tooth to form the small support pads or projections.

SUMMARY OF THE INVENTION

In accordance with the invention, it has now been found that more uniform support for large semiconductor wafers can be achieved in vertical wafer carriers by using long teeth or support arms containing a raised support structure that typically extends along each tooth a distance greater than about 50%, preferably greater than about 70%, of the tooth's length in such a manner as to provide support for each wafer from a point located inward from the edge of the wafer a distance equal to less than 9% of the wafer's radius to a point located from the center of the wafer a distance equal to between about 25% and about 80% of the wafer's radius. Such teeth and their associated support structures can provide essentially continuous support from the wafer periphery inward and effectively reduce stress induced by the wafer's own weight. Moreover, by utilizing a support structure integral with each tooth that extends from the front tip of a tooth to near its back end, the strength of each individual tooth is increased.

Typically, the wafer carriers of the invention effectively support semiconductor wafers having diameters between about 195 and 410 millimeters utilizing three or more support rails which extend vertically between a top portion and a bottom portion of the carrier. The raised structure which supports the wafers generally runs from the tip of a tooth continuously toward the back and has a surface area between about 20 and about 200 square millimeters when supporting wafers having nominal diameters between 200 and 400 millimeters. Typically, the support structure is a ledge which runs along one side of each tooth and continuously supports the wafer from the edge of the wafer to a point located from the center of the wafer between about 40% and about 65% of the wafer's radius.

The use of a structure that extends over 50% of the length of a tooth to support a wafer, as opposed to a support projection or pad as disclosed in U.S. Pat. No. 5,492,229, results in more effective and uniform support for the wafer and thereby more effectively decreases the stress on the wafer caused by its own weight. In addition, such a support structure, when integral with each tooth, provides increased strength to the teeth of the carrier.

BRIEF DESCRIPTION OF THE DRAWINGS

All identical reference numerals in the figures of the drawings refer to the same or similar elements or features.

DETAILED DESCRIPTION OF THE INVENTION

Figure 1:
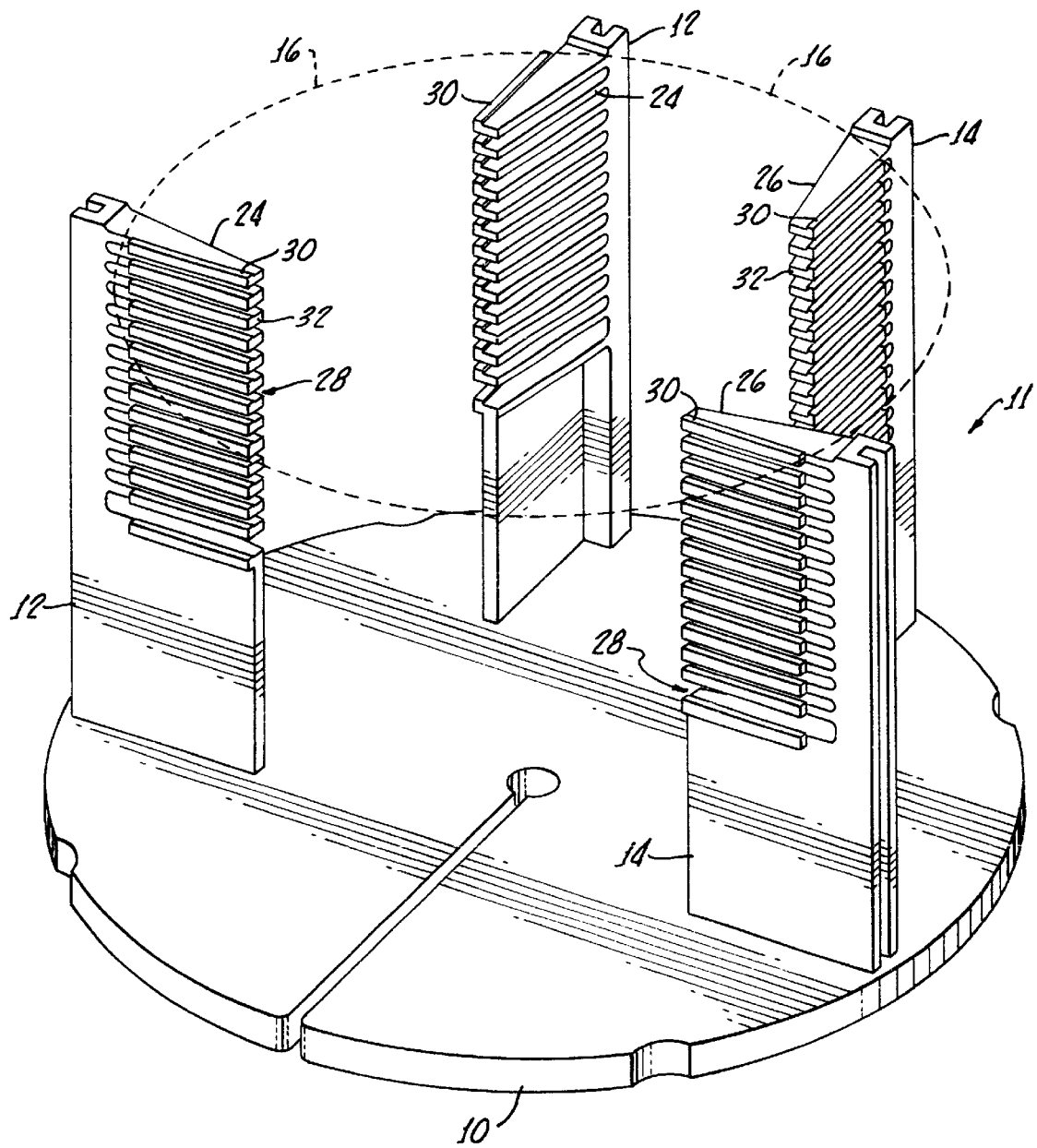
FIG. 1 in the drawings is a partial perspective view of a preferred embodiment of a semiconductor wafer carrier of the invention with the top portion cut away so that it can be seen how a hypothetical wafer would be held in the carrier.
Figure 2:
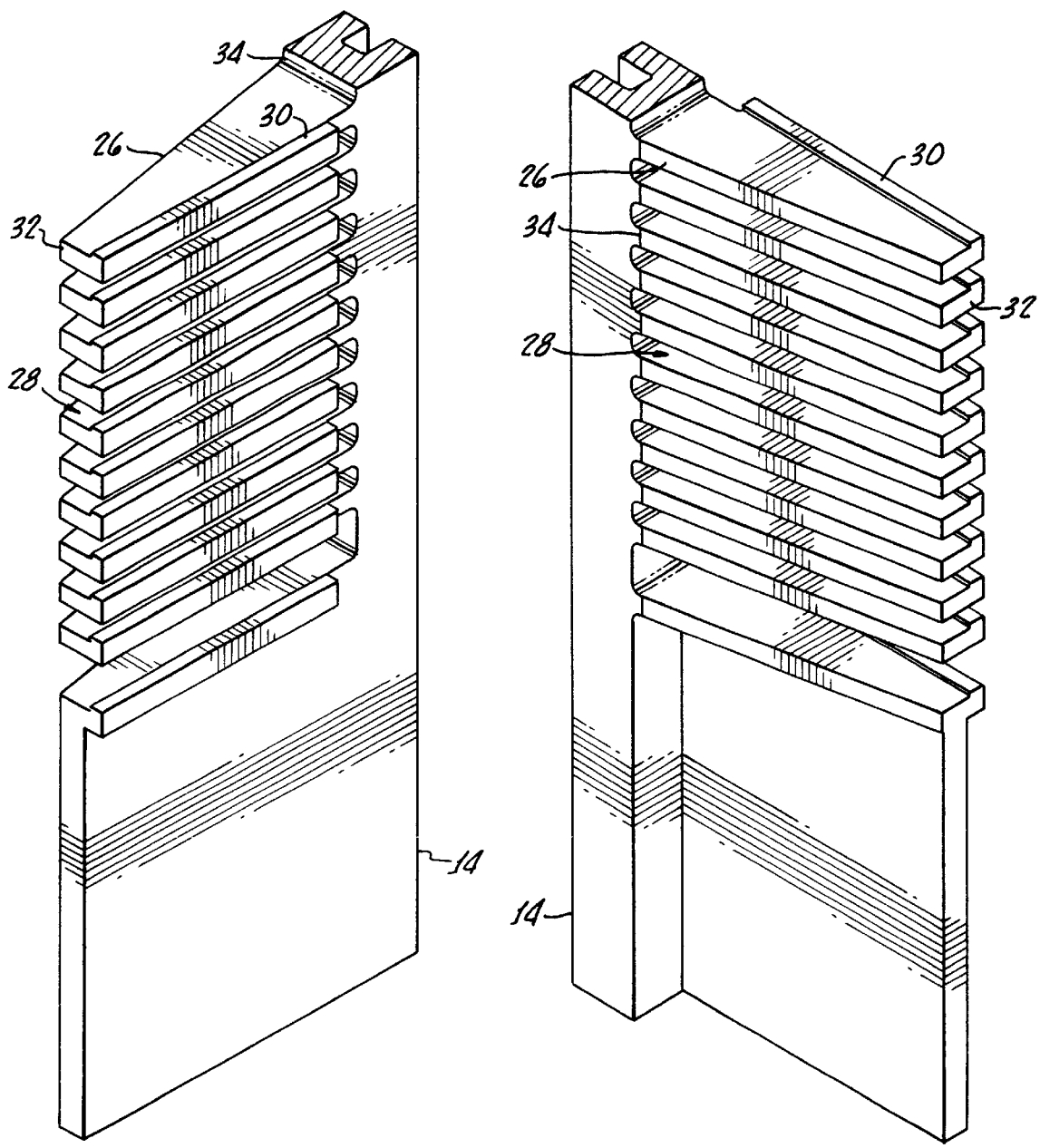
FIG. 2 is a perspective view of each side of one of the vertical support members or rails shown in FIG. 1.
Figure 3:
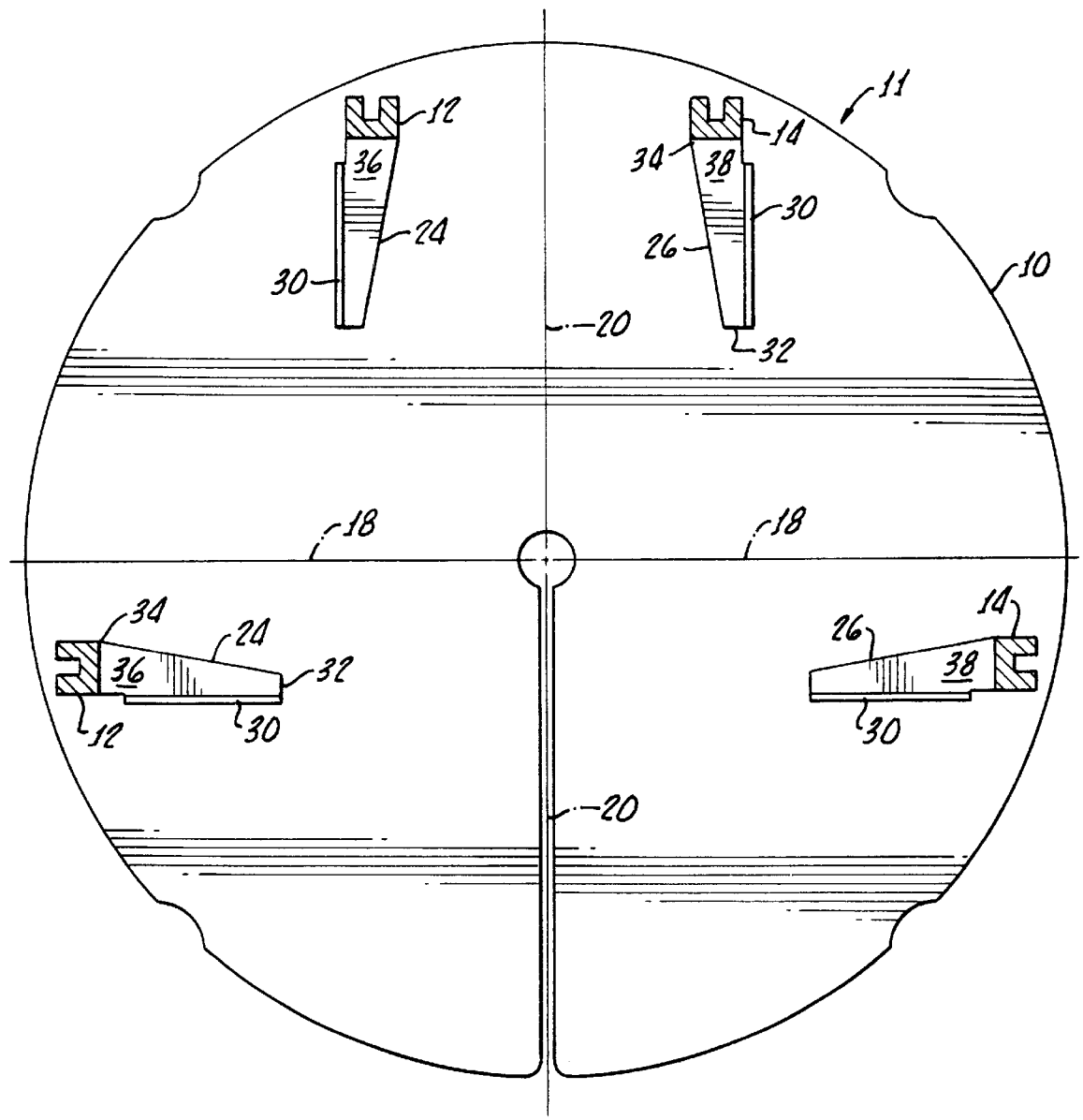
FIG. 3 is a top view of the portion of the wafer carrier shown in FIG. 1.

FIGS. 1 and 3 in the drawings show a preferred embodiment of a semiconductor wafer carrier 11 of the invention. The carrier comprises a bottom portion or plate 10 on which are mounted four vertical supports or rails 12 and 14 which extend upward between the bottom plate and a top portion or plate not shown in the figures. The two rails 12 located on the left side of the carrier, i.e., to the left of the centerline 20 of plate 10, are identical and are mirror images of the two rails 14 located on the right side of the carrier, i.e., to the right of centerline 20. The two rails 14 are identical with each other and are mirror images of rails 12. Perspective views illustrating the details of each side of a rail 14 is shown in FIG. 2. Generally, the design of the bottom plate 10 and top plate is dependent on the type of apparatus used to move the carrier in and out of the furnace where the wafers are to be heat treated and the design of the furnace itself.

For purposes of illustrating and explaining the invention, a wafer 16 is shown in FIG. 1 as a dotted line in its appropriate position after being inserted into the wafer carrier 11. Generally, the design of the wafer carrier depends upon the size of the wafers to be held and supported. Typically, the nominal diameter of the wafers held in the carrier ranges from about 200 to about 400 millimeters, although other diameter wafers can be accommodated if desired. Such wafers usually have a thickness which ranges from about 0.5 to about 1.5 millimeters.

Each support rail 12 and 14 contains a plurality of support arms or teeth 24 and 26, respectively, which in turn define slots 28 into which the semiconductor wafers are inserted. The slots are aligned so that a single wafer can be jointly received by a corresponding slot in each rail, thereby allowing the carrier to hold wafers in a stack. Each tooth 24 and 26 contains a ledge 30 which runs along a side of the tooth from its front tip 32 toward its back edge 34. The ledge serves to support a wafer, normally from the edge of the wafer inward toward a centerline 18 or 20 of the wafer as illustrated in FIG. 3.

The long support teeth 24 and 26 are created in rails 12 and 14, respectively, by machining slots 28 into the rails. Although the rails shown in FIGS. 1–3 are plate-like members in an L-shape, the rails can have other shapes. For example, they may have U-shaped or C-shaped cross sections. The actual length of the rails is dependent upon the height of the furnace in which the semiconductor wafers are to be treated. Typically, the rails will vary in length between about 0.5 and 1.5 meters, but are usually somewhere between about 0.6 and about 1.0 meter in length.

Although FIGS. 1 and 3 show that there are four support rails in the wafer carrier of the invention, it will be understood that carriers containing two or three rails are within the scope of the invention. Although three or four support rails are normally optimum from a point of view of support and cost of fabrication of the wafer carrier, more rails may be used if desired.

As can be seen from FIGS. 1 and 3, rails 12 are attached to and located on the left side (to the left of centerline 20) of bottom plate 10, whereas rails 14 are located on the right side (to the right of centerline 20). Ideally, for the most uniform support of wafers, the four rails should be equally spaced, i.e., 90°, from each other in a circle on the bottom plate. Unfortunately, such an arrangement does not permit placement of the wafers into the carrier. In order for there to be sufficient clearance to load the wafers into the front of the wafer carrier, each rail 12 and 14 located in front of centerline 18 of plate 10 normally must be spaced between about 150° and about 175° from each other when measured the short way around bottom plate 10. When it is desired to utilize only three rails for support, two of the rails are located toward the front of the wafer carrier as shown in FIGS. 1 and 3 while one rail is located at the back of the carrier, normally on the centerline 20 of the bottom plate. Typically, the front rails support between about 55 percent and about 90 percent of the weight of each wafer.

The number of slots 28 in each rail 12 and 14 depends upon the number of semiconductor wafers to be held by the wafer carrier. This, in turn, depends upon the size of the furnace to be used for heat treatment and the separation desired between wafers to adequately expose both the top and bottom surfaces of the wafers to the heat treatment. Normally, each rail contains between about 50 and 240 slots. For a typical larger size furnace, the number of slots normally ranges between about 80 and about 150.

The teeth 24 and 26 of rails 12 and 14, respectively, are formed when the slots are cut into the rails. The shape of the teeth typically depends upon the shape of the plate-like member from which the rails are fabricated. Although the teeth 24 and 26 as shown in FIGS. 1 through 3 are wedge-shaped, i.e., they taper outwardly from their front tip 32 toward their back end 34, the teeth can also be in the shape of a long rectangle or curved as is an arc of a circle. Generally, when the teeth are straight, they range in length between about 20% to about 80% of the semiconductor wafer's radius, preferably between 40% and 60%. Normally, the teeth are between about 20 and 150 millimeters long, preferably 50 to 100 millimeters.

Each tooth on a rail contains a support structure or ledge 30 which runs usually continuously along one side of the tooth from the front tip of the tooth 32 toward the back end of the tooth 34 a distance equal to at least 70%, usually at least 80%, of the length of the tooth. The ledge provides support for the semiconductor wafer which is received in the slot between two teeth. The support structure or ledge is designed to provide support for the wafer usually from the edge of the wafer inward to a point located from the center of the wafer a distance equal to between about 25% and about 80%, preferably between about 45% and 60%, of the wafer's radius. Although it is preferred that the ledge support the wafer beginning at its edge inward, the actual support may begin as far as 9% of the wafer's radius from the edge of the wafer, more preferably less than 5% of the wafer's radius from the edge of the wafer.

Although support structure or ledge 30 is normally designed to provide continuous support to a wafer from its edge inward, it is preferable that the contact area with the underside of the wafer be as small as possible in order to expose the maximum amount of wafer surface area to the heat treating process and to reduce heat transfer by thermal conductivity to the bottom of the wafer, which heat transfer will cause nonuniform expansion and stress on the wafer. Of course, the actual surface area of the top of the support structure 30 will depend upon the size of the tooth, which in turn depends upon the size of the wafer to be supported. Typically, for a wafer having a nominal diameter between about 200 and 400 millimeters, the surface area of the top of the support structure will range between about 20 and 200 square millimeters, preferably between about 30 and 120 square millimeters.

The height of the support structure 30 is normally sufficient to allow gases in the furnace to access the area between the top surface of teeth 24 and 26, represented respectively by reference numerals 36 and 38 in FIG. 3, and the underside of each wafer. Typically, the height ranges between about 0.25 and about 2.5 millimeters, preferably between 0.5 and 1.25 millimeters. The distance between the top of the support structure or ledge and the bottom surface of the next higher adjacent tooth usually ranges between about 0.75 and about 4.0 millimeters, preferably between about 1.5 and 3.0 millimeters.

Although the support structure 30 shown in FIGS. 1 through 3 is in the shape of a ledge running along a side of each tooth from its tip 32 substantially continuously toward its back edge 34, it will be understood that the wafer carrier of the invention is not limited to having support structures in this shape or location. For example, the support structure may be a ledge that runs down the center of the tooth, a narrow lip along the edges of the tooth, a line-like contact along the center of the tooth, a series of short, interrupted pads running along the edges of the tooth or down the middle of the tooth, or some other means for support. Regardless of the shape the support structure takes or its location, it is important that it provide support for the underside of a semiconductor wafer from a point located within a distance equal to 9% of the wafer's radius from the edge of the wafer inward to a point located from the center of the wafer a distance between 25% and 80% of the wafer's radius. Although it is preferred that the support be structurally continuous as is the support ledge shown in the figures, a discontinuous support structure, such as series of pads, will suffice if it provides support over the specified distance and occupies more than about 50% of the length of a tooth.

It has been found that, when the support structure supplies support to each wafer beginning at a point near the edge of the wafer and continuing inward, stress caused by the wafer's weight is substantially reduced as compared to when support is supplied only at the inner portion of the wafer. Moreover, utilizing a support structure which is integral with and occupies at least 50% of the length of each tooth increases the strength of each individual tooth.

As illustrated in FIG. 1, wafer carrier 11 of the invention is comprised of bottom plate 10, rails 12 and 14, and a top plate not shown. Usually, the top and bottom plates and the rails are all made of the same high strength and high purity ceramic material, which is normally substantially resistant to chemical corrosion and has a high heat resistance. Examples of such ceramic materials include quartz, carbon, graphite, monocrystal silicon, polycrystal silicon, silicon carbide, and silicon carbide impregnated with silicon.

As mentioned previously, the teeth of the rails are usually formed by machining slots 28 into the rails. Thus, the teeth and the rails form a monolithic or uni-body structure in which the teeth and rails are integral with each other. Although it is possible that the raised support structures could be added to the teeth after they are cut from the rails, it is preferred that the support structures also be cut from the rails with the teeth so that they form a monolithic structure with the rails and teeth. Thus, in fabricating the wafer carrier of the invention, slots are machined into the rails to form the teeth with the appropriate support structures integral therewith, and the rails are then attached to the bottom and top plates.

When a relatively soft ceramic material, such as graphite, is used to fabricate the wafer carrier of the invention, conventional precision cutting machines may be used to cut the slots in the rails. It is preferred, however, that the wafer carrier be made of silicon carbide, which is a very strong and hard ceramic material that more easily withstands the harsh environment of the heat treatment furnaces in which the semiconductor wafers are processed. Unfortunately, it is very difficult to machine teeth and their associated support structures of desired dimensions into rails made of silicon carbide with the accuracy required by the semiconductor manufacturers that use wafer carriers. It has now been found that, in fabricating wafer carriers of the invention made of silicon carbide, it is much easier to first machine the teeth into rails made of the softer graphite, convert the graphite to silicon carbide, and then carry out any final cutting or grinding needed to produce teeth and support structures to exact specifications.

Figure 4:
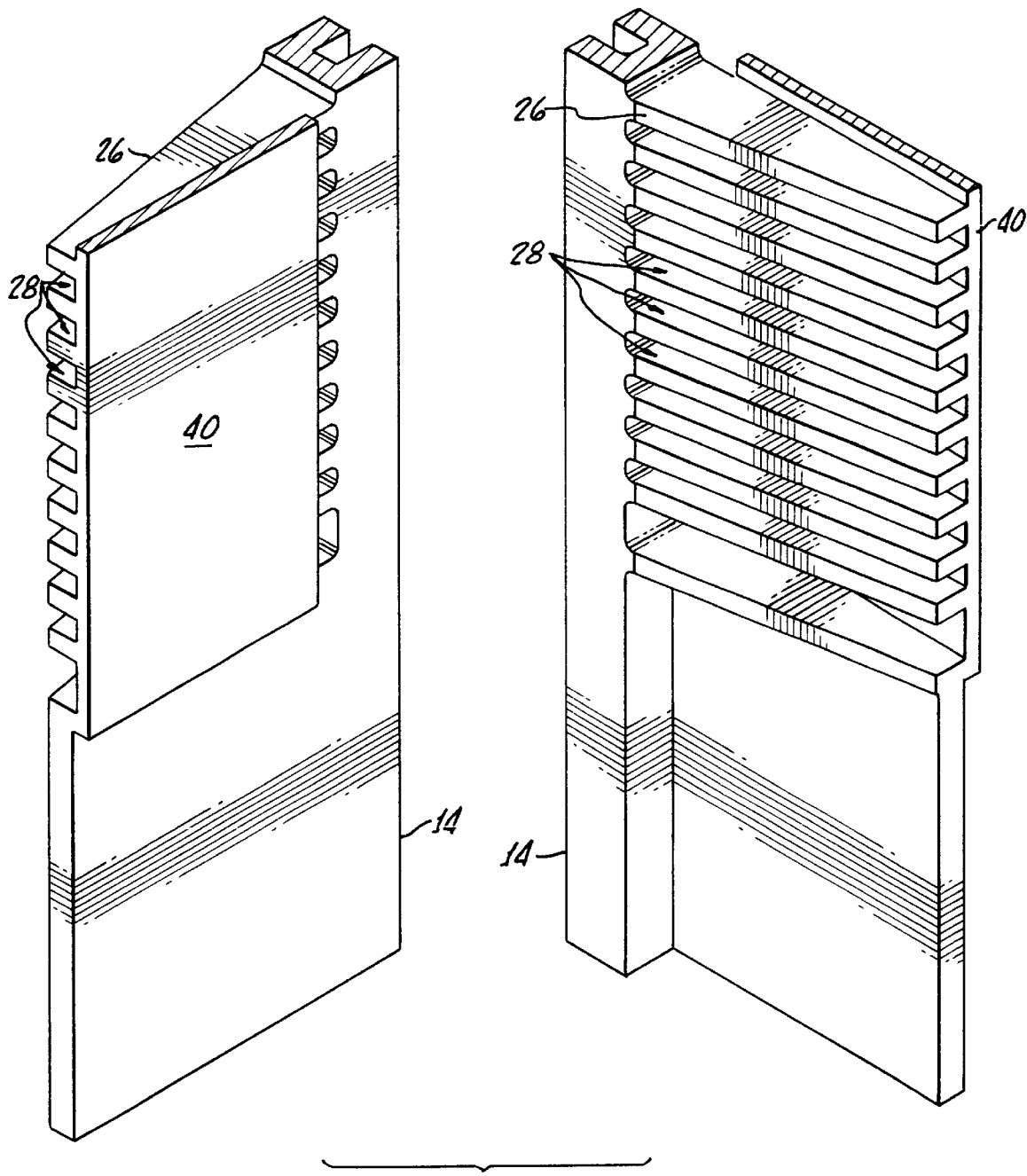
FIG. 4 is a perspective view of each side of a vertical support member or rail just prior to the support ledges being formed at the side of each tooth.

The first step in fabricating a silicon carbide wafer carrier of the invention is to cut a plate of graphite, preferably one having a cross-section in a L-shaped wedge as shown in FIG. 3, from a block of graphite. Graphite is then removed from the plate, normally using an endmill, to form a first series of parallel grooves or slots 28 but leaving a "back" wall 40 intact as shown in FIG. 4 for a rail 14 to be used on the right side of the carrier. Normally, the slots are cut into the plate to a depth such that back wall 40 is not penetrated and is between about ¼ and about 6 millimeters, preferably between ½ and 3 millimeters, thick. Rails 12 to be used on the left side of the wafer carrier are then fabricated out of graphite in the same manner. These partially fabricated graphite rails and the graphite bottom and top plates, which are also cut from graphite blocks in the desired design, are then converted into silicon carbide by heating them to high temperatures in a furnace in the presence of silica and carbon. At the elevated temperatures in the furnace, the silica reacts with carbon to form silicon monoxide which then reacts with the carbon in the graphite to form silicon carbide. This method of converting graphite into silicon carbide is described in more detail in U.S. Pat. Nos. 1,013, 700 and 3,634,116, the disclosures of which are incorporated herein by reference in their entireties.

Once the rails and top and bottom plates have been converted to silicon carbide, slots of a width smaller than those cut in the graphite are ground into the "back" wall 40 remaining on rails 14 and 12. Typically, these slots are ground into the wall with conventional silicon carbide grinding equipment, such as computer numeric controlled grinders equipped with diamond wheels, between the bottom surface of one tooth 26 and the top surface of the next adjacent tooth, thereby forming support ledges 30 as shown in FIG. 2. Although FIG. 2 does not show ledges similar to ledge 30 on the bottom of each tooth, such ledges will very often be present due to the manufacturing technique used to make the silicon carbide rails. Once the slots are cut to form the ledges, the wafer carrier is assembled by connecting the rails to the bottom and top plates normally using graphite cement. The assembled wafer carrier is then subjected to the silicon carbide conversion process described above in order to convert the graphite cement into silicon carbide, thus forming the silicon carbide wafer carrier.

Figure 5:
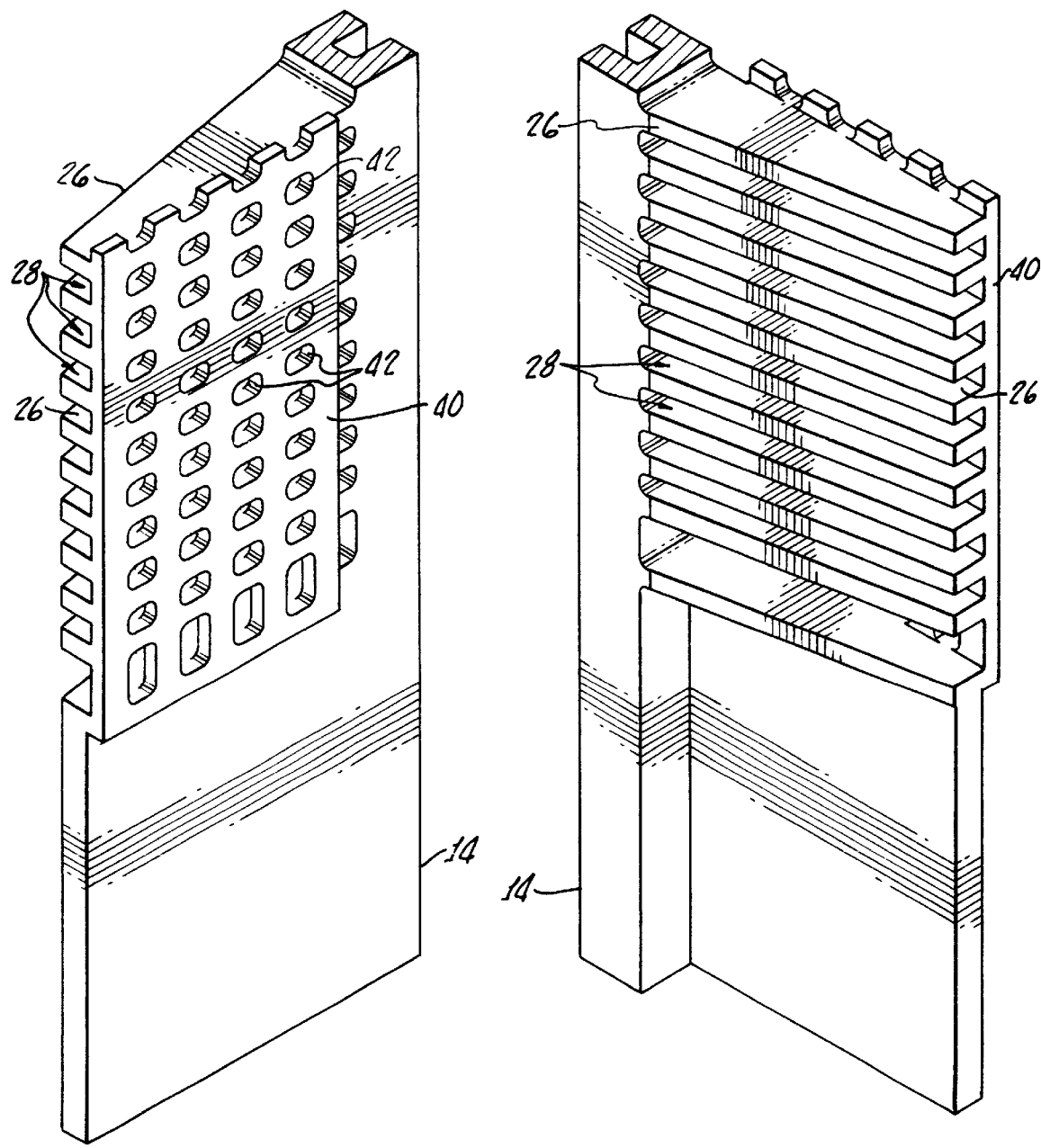
FIG. 5 is a perspective view of each side of a vertical support member or rail just prior to a series of interrupted or spaced pads being formed at the side of each tooth.

In the above-described embodiment of the invention, the fabricated silicon carbide rails comprise teeth that have a support structure in the form of a continuous ledge running along one side of each tooth. In an alternative embodiment of the invention, the support structure is a series of short interrupted pads that run along one side of each tooth. Such rails are fabricated in a somewhat similar manner as described above for making rails having continuous ledges but differ in that the back wall 40 of the graphite plate is penetrated in such a manner as to form a series of parallel interrupted slots 42 as shown in FIG. 5. These slots connect with the slots 28 cut into the plate from its front side. The interrupted slots, which normally have a width equal to that of the parallel slots 28, can be cut into the back wall of the graphite plate either before, after or at the same time that the parallel slots 28 are cut into the front side of the graphite plate.

Once the interrupted slots 42 have been cut into the back side wall 40 of the graphite plate, the plate is converted to silicon carbide as described above. The interrupted pads 44 shown in FIG. 6, which figure depicts a finished silicon carbide rail 14 of the invention, are then formed by using conventional silicon carbide grinding equipment to connect horizontally adjacent slots 42 shown in FIG. 5 with each other on the back side wall 40. This is accomplished by grinding a series of grooves or slots of a width smaller than that of slots 28 into the back side wall 40 of the silicon carbide plate between the bottom surface of one tooth 26 and the top surface of the next adjacent tooth, thereby forming the series of interrupted pads 44 on each tooth. Although FIG. 6 does not show interrupted pads similar to the pads 44 on the bottom of each tooth, such pads will very often be present due to the manufacturing technique used to make the silicon carbide rails. Once these silicon carbide rails are fabricated, they are assembled to form a wafer carrier of the invention as described previously.

Figure 6:
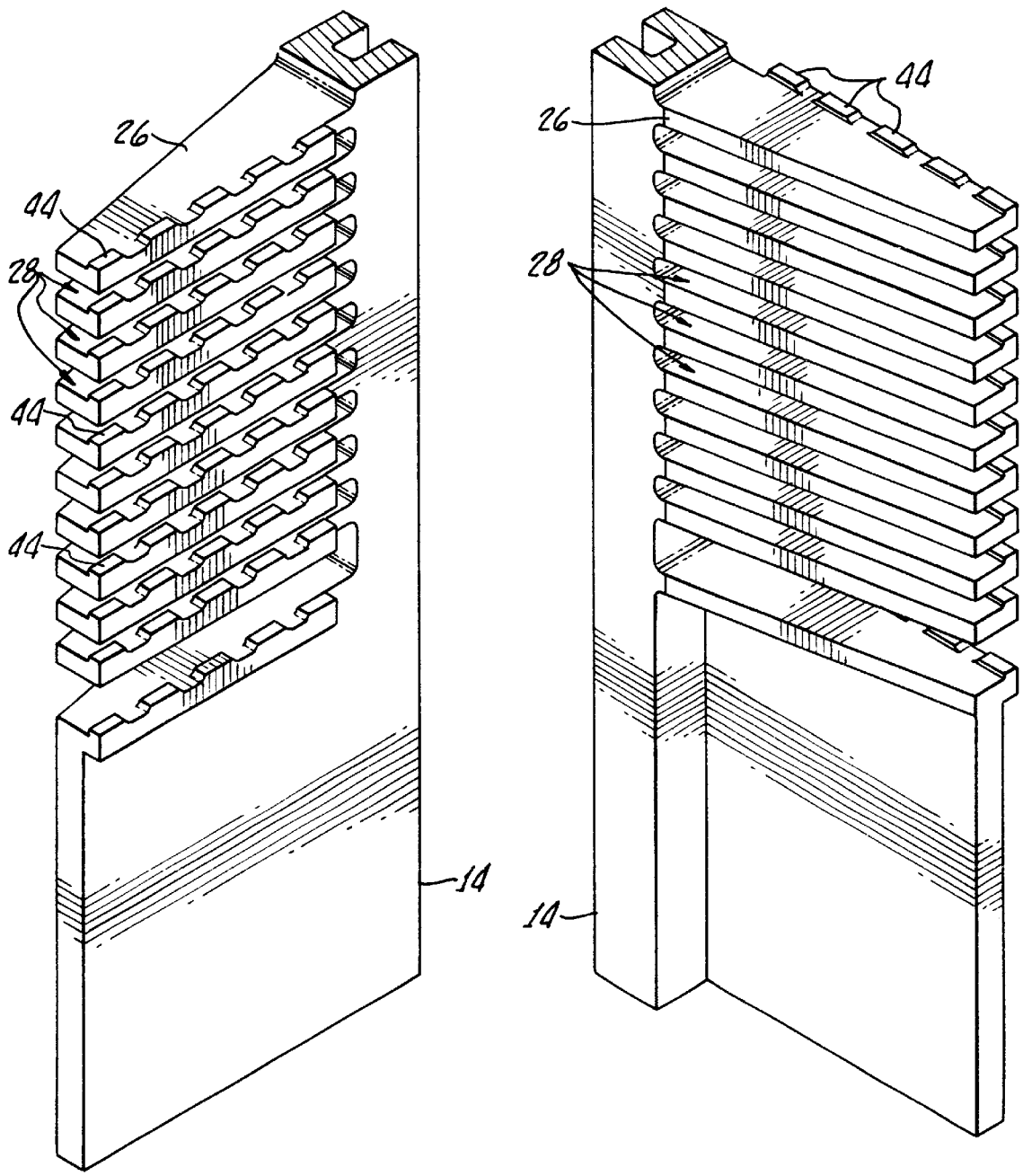
FIG. 6 is a perspective view of each side of a silicon carbide vertical support member or rail after a series of interrupted or spaced pads have been formed at the side of each tooth.

The length of the support pads 44 shown in FIG. 6 is determined by the distance between horizontally adjacent slots 42. Usually, this distance is set so the pads have a length between about 2 and about 30 millimeters, preferably between about 3 and about 12 millimeters.

The method of the invention as described above has several advantages when used to manufacture silicon carbide rails or supports for use in vertical carriers designed to hold large wafers. First, by machining the major portion of the slots which form the rail teeth in softer graphite, the amount of silicon carbide that has to be machined is greatly reduced. This results in less incidences of tooth and rail breakage and a lower manufacturing scrap rate. Second, since smaller amounts of silicon carbide need to be machined, the support structures can be more precisely ground to meet required final tolerances.

Although this invention has been described by reference to several embodiments of the invention, it is evident that many alterations, modifications and variations will be apparent to those skilled in the art in light of the foregoing description. Accordingly, it is intended to embrace within the invention all such alternatives, modifications and variations that fall within the spirit and scope of the appended claims.

I claim:

1. A method for making a silicon carbide rail containing teeth for use as a support in an apparatus for holding a plurality of semiconductor wafers, which method comprises:

(a) forming a first series of parallel slots into a solid plate of graphite having a front side and a back side, wherein each of said slots extends from said front side toward said back side, thereby forming a back side wall;

(b) converting said graphite plate into silicon carbide to form a slotted silicon carbide plate having a back side wall; and (c) forming in said back side wall of said slotted silicon carbide plate a second series of parallel slots, wherein each slot in said second series of slots has a width less than the width of its corresponding slot in said first series of parallel slots and connects with its corresponding slot in said first series to form said teeth with a ledge running along their top surfaces.

2. The method as defined by claim 1 wherein said second series of slots are ground into the back side wall of said silicon carbide plate.

3. The method as defined by claim 1 wherein said slots in said first series extend from said front side of said graphite plate toward said back side of said graphite plate a distance such that said back side wall of said graphite plate is between about ¼ and about 6 millimeters thick.

4. The method as defined by claim 1 wherein none of the slots in said first series of parallel slots penetrate said back side wall of said graphite plate.

5. The method as defined by claim 1 wherein said slots in said first series extend from said front side of said graphite plate toward said back side of said graphite plate a distance such that said back side wall of said graphite plate is between about ½ and about 3 millimeters thick.

6. The method as defined by claim 1 wherein said ledge is between about 0.25 and about 2.5 millimeters in height.

7. The method as defined by claim 1 wherein the surface area of the top of said ledge is between about 20 and about 200 square meters.

8. The method as defined by claim 1 wherein the surface area of the top of said ledge is between about 30 and about 120 square meters.

* * * * *